(12) United States Patent
Kluth et al.

(10) Patent No.: US 6,391,730 B1
(45) Date of Patent: May 21, 2002

(54) PROCESS FOR FABRICATING SHALLOW POCKET REGIONS IN A NON-VOLATILE SEMICONDUCTOR DEVICE

(75) Inventors: George J. Kluth; Arvind Halliyal, both of Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/670,229

(22) Filed: Sep. 25, 2000

Related U.S. Application Data

(60) Provisional application No. 60/181,685, filed on Feb. 11, 2000.

(51) Int. Cl.[7] ............................................. H01L 21/336
(52) U.S. Cl. ........................ 438/302; 438/303; 438/305
(58) Field of Search ................................ 438/302, 303, 438/305, 257–267

(56) References Cited

U.S. PATENT DOCUMENTS 5,943,576 A * 8/1999 Kappor ........................ 438/302
6,168,993 B1 * 1/2001 Foote et al. ................. 438/262

* cited by examiner

Primary Examiner—David Nelms
Assistant Examiner—Dung A Le
(74) Attorney, Agent, or Firm—Amin & Turocy, LLP

(57) ABSTRACT

A process for fabricating shallow pocket regions in a non-volatile semiconductor device includes providing a semiconductor substrate having a principal surface. A masking pattern is formed to overlie the principal surface that includes an opening therein. An angled, molecular ion implantation process is carried out to form first and second shallow pocket regions in the semiconductor substrate. The first and second pocket regions at least partially underlie the first and second sidewalls, respectively, of the opening in the patterned layer. Further processing steps are then carried out to form a bit-line region in a non-volatile semiconductor device.

19 Claims, 3 Drawing Sheets

PROCESS FOR FABRICATING SHALLOW POCKET REGIONS IN A NON-VOLATILE SEMICONDUCTOR DEVICE

CROSS REFERENCE TO RELATED APPLICATION

This application claims benefit of provisional of No. 60/181,685 filed Feb. 11, 2000.

FIELD OF THE INVENTION

The present invention relates, generally, to methods for fabricating semiconductor devices and, more particularly, to methods for fabricating non-volatile semiconductor devices, such as EEPROM devices.

BACKGROUND OF THE INVENTION

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Typically, an EEPROM device includes a floating-gate electrode upon which electrical charge is stored. The floating-gate electrode overlies a channel region residing between source and drain regions in a semiconductor substrate. The floating-gate electrode together with the source and drain regions forms an enhancement transistor. By storing electrical charge on the floating-gate electrode, the threshold voltage of the enhancement transistor is brought to a relatively high value. Correspondingly, when charge is removed from the floating-gate electrode, the threshold voltage of the enhancement transistor is brought to a relatively low value. The threshold level of the enhancement transistor determines the current flow through the transistor when the transistor is turned on by the application of appropriate voltages to the gate and drain. When the threshold voltage is high, no current will flow through the transistor, which is defined as a logic 0 state. Correspondingly, when the threshold voltage is low, current will flow through the transistor, which is defined as a logic 1 state.

Product development efforts in EEPROM device technology have focused on increasing the programming speed, lowering programming and reading voltages, increasing data retention time, reducing cell erasure times and reducing cell dimensions. Silicon nitride in combination with silicon dioxide is known to provide satisfactory dielectric separation between the control-gate electrode and the channel region of the enhancement transistor, while possessing electrical characteristics sufficient to store electrical charge. During programming, electrical charge is transferred from the substrate to the silicon nitride layer located in an oxide-nitride-oxide (ONO) layer.

Non-volatile memory designers have taken advantage of the ability of silicon nitride to store charge in localized regions and have designed memory circuits that utilize two regions of stored charge within the ONO layer. This type of non-volatile memory device is known as a two-bit EEPROM. The two-bit EEPROM is capable of storing twice as much information as a conventional EEPROM in a memory array of equal size. A left and right bit is stored in physically different areas of the silicon nitride layer, near left and right regions of each memory cell. Programming methods are then used that enable two-bits to be programmed and read simultaneously. The two-bits of the memory cell can be individually erased by applying suitable erase voltages to the gate and to either the source or drain regions.

These devices require pocket regions near the source and drain regions on either side of the channel. Electrons are sourced from the pocket regions and injected into the nitride layer. As devices are scaled to smaller dimensions, it becomes more difficult to form the pocket regions at precise locations in the channel region. While the recent advances in EEPROM technology have enabled memory designers to double the memory capacity of EEPROM arrays using two-bit data storage, numerous challenges exist in the fabrication of material layers within these devices. In particular, the pocket regions must be carefully fabricated to avoid excessive overlap with the source and drain regions. Accordingly, advances in fabrication technology are necessary to insure proper function two-bit EEPROM devices as device dimensions are scaled to smaller values.

SUMMARY OF THE INVENTION

The present invention is for a process of fabricating pocket regions in a non-volatile semiconductor device. The pocket regions are typically formed adjacent to and on either side of a buried-bit line in an EEPROM device. Improved device performance is attained at extremely small feature size by implanting molecular ions into the substrate to form the pocket regions. The use of molecular ions enables the pocket regions to be formed to have a relatively high dopant concentration, yet exhibit a very shallow junction depth ($X_j$). As EEPROM devices are scaled to extremely small dimensions, it becomes necessary to reduce the junction depth of the doped regions that form source, drain, bit-line and channel regions in the substrate. A process carried out in accordance with the present invention enables devices within an EEPROM memory cell to be fabricated to extremely small dimensions, while maintaining optimum electrical performance.

In one form, a process for fabricating a non-volatile semiconductor device includes providing a semiconductor substrate having a patterned layer thereon. The patterned layer has an opening that exposes a bit-line region of the semiconductor substrate. Molecular ions are implanted into the substrate at an offset angle with respect to the normal of a principal surface of the substrate to form first and second pocket regions to a first junction depth. Then, a buried bit-line is formed in the bit-line region of the substrate to a second junction depth. The processing steps are carried out such that the second junction depth is greater than the first junction depth.

It will be appreciate that, for simplicity and clarity of illustration, elements shown in the Figures have not neces-

DETAILED DESCRIPTION OF THE PREFERRED EMBODIMENTS

Figure 1:
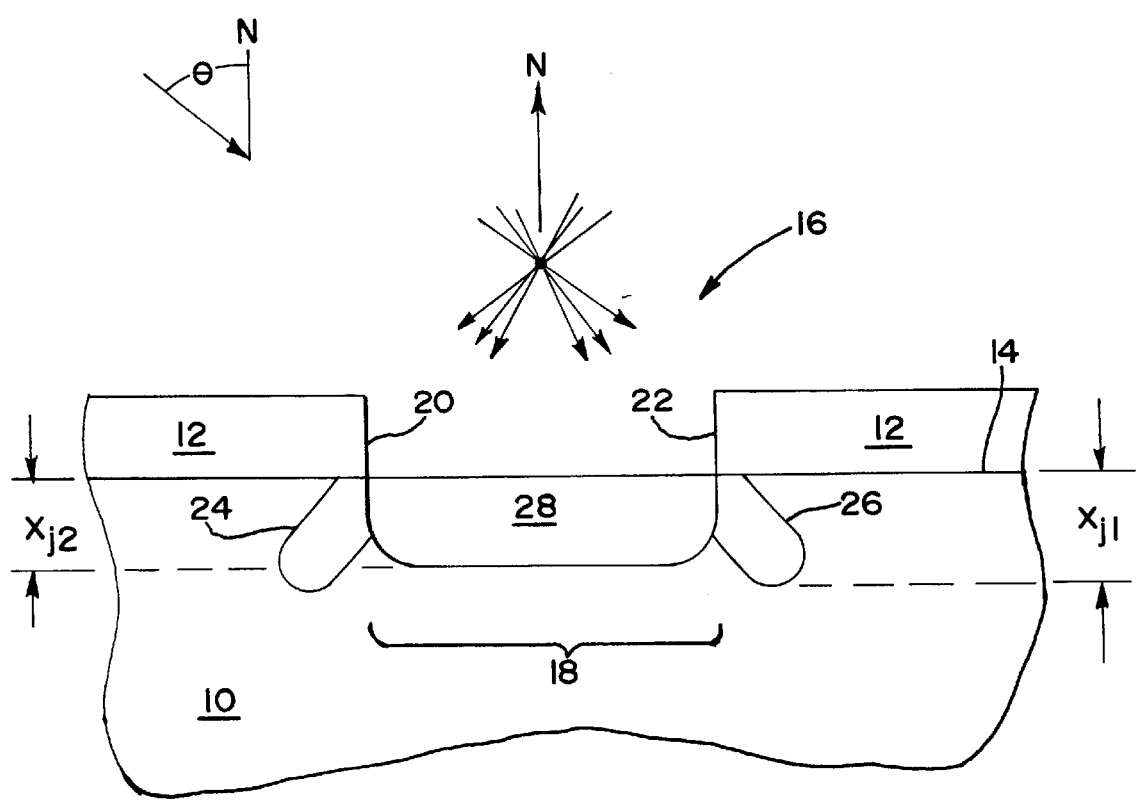
FIG. 1 illustrates, in cross-section, a molecular ion implantation process for the formation of pocket regions in a semiconductor substrate.

Shown in FIG. 1, in cross-section, is a portion of a semiconductor substrate 10 undergoing an angled, molecular ion implantation process. A patterned layer 12 overlies a principal surface 14 of semiconductor substrate 10. Patterned layer 12 includes an opening 16 that exposes a bit-line region 18 of semiconductor substrate 10. Opening 16 of patterned layer 12 has first and second substantially vertical sidewalls 20 and 22. Patterned layer 12 can be any of a number of organic and inorganic materials used in the fabrication of semiconductor devices. Additionally, patterned layer 12 can be a composite layer that includes both organic and inorganic material layers. For example, patterned layer 12 can be a resist layer overlying a dielectric layer. Additionally, patterned layer 12 can be a hard-mask layer, such as silicon nitride, silicon dioxide, and combinations thereof, and the like. Further, resist materials that can be used to form patterned layer 12 include, photoresist, deep-UV resist, X-ray resist, and the like. In a preferred embodiment, the resist material is a Novolak-type photoresist material. The Novolak-type resist can include additional components, such as metals, chemical accelerators, and the like.

In accordance with the invention, an angled, molecular ion implantation process is carried out to form first and second pocket regions 24 and 26, respectively, in semiconductor substrate 10. The angled ion implantation process is carried out such that first pocket region 24 at least partially underlies first substantially vertical sidewall 20. Correspondingly, second pocket region 26 at least partially underlies second substantially vertical sidewall 22. The particular geometry of first and second pocket regions 24 and 26 results from the molecular ion implantation being carried out an off-set angle (2) with respect to the normal (N) of principal surface 14. In a preferred process of the invention, the off-set angle 2 can vary from about 20° to about 45° depending upon the particular ionic species being implanted.

An important aspect of the present invention relates to the junction depth ($X_{j1}$) of first and second pocket regions 24 and 26. As used herein, the term "junction depth" refers to the distance from principal surface 14 to the deepest point of formation of a p/n junction associated with the implanted region within the substrate. Accordingly, the junction depth of first and second pocket regions 26 and 28 in semiconductor substrate 10 is determined by the distance from principal surface 14 to the deepest point of formation of first and second pocket regions 26 and 28 (a distance $X_{j1}$ extending from principal surface 14).

In a conventional fabrication process, pocket regions are typically formed by singular ionic species. Those skilled in the art will appreciate that the various ionic species commonly implanted in semiconductor device fabrication each have individual range statistics in <100> silicon. At a given implant energy, the implanted species will penetrate the silicon substrate to a predetermined depth based on the implant energy and the particular range statistics of the implanted species. As device geometries are scaled to smaller dimensions, a concomitant reduction in junction depth is necessary for optimum device performance. For example, as the lateral dimension of opening 16 is reduced, the junction depth of the pocket regions ($X_{j1}$) must also be reduced. Those skilled in the art will further realize that, as the required junction depth becomes smaller, it becomes more difficult to control the range statistics of implanted species. This is because, at least in part, ion implantation equipment becomes more difficult to operate as the ion acceleration energy is reduced to extremely low values. In addition to depth control, ion implant dose uniformity can also be problematic at extremely low acceleration energies.

In accordance with the invention, a very small junction depth ($X_{j1}$) is achieved for the fabrication of pocket regions 24 and 26 by carrying out the implant process with a molecular ion. In a preferred embodiment, pocket regions 24 and 26 are formed to have a p-type conductivity by the ion implantation of boron difluoride ($BF_2^+$) molecular ions. The high molecular weight of $BF_2^+$ relative to the boron single ionic species B enables an ion implantation system to be operated at higher acceleration voltages, while forming a doped region having a small junction depth. In accordance with a preferred embodiment of the invention, $BF_2$ is implanted into semiconductor substrate 10 at an angle of incidence relative to the normal (N) of about 20° to about 45°, and at an implant energy of about 50 KeV to about 80 KeV.

In addition to pocket regions 24 and 26, a buried bit-line 28 is also formed in semiconductor substrate 10. Preferably, buried bit-line 28 is formed to have a junction depth ($X_{j2}$). In similarity with pocket regions 24 and 26, buried bit-line 28 must also be formed at a reduced junction depth as the non-volatile semiconductor device is scaled to smaller feature sizes. Additionally, for proper functioning, the junction depth ($X_{j2}$) of buried bit-line 28 must be less than the junction depth ($X_{j1}$) of first and second pocket regions 24 and 26. However, the magnitude of the difference between junction depth ($X_{j2}$) and junction depth ($X_{j1}$) cannot be beyond predetermined design values. Accordingly, the junction depth of the buried bit-line regions determines a maximum value for the junction depth of the pocket regions. In a preferred embodiment of the invention, buried bit-line 28 is formed by ion implantation of an n-type dopant at an angle substantially normal to principal surface 14 of semiconductor substrate 10.

In a preferred embodiment, first and second pocket regions 24 and 26 are formed to a junction depth of about 0.30 microns to about 0.45 microns. Further, buried bit-line 28 is preferably formed to a junction depth of about 0.07 microns to about 0.12 microns. Those skilled in the art will recognize that various annealing processes can be carried out and that those annealing processes will diffuse dopant atoms in a semiconductor substrate. Accordingly, the final junction depth of first and second pocket regions 24 and 26, and buried bit-line 28 will depend upon the time and temperature of the annealing processes carried out subsequent to the ion implantation processes.

It is believed that those skilled in the art can, without further elaboration, fully practice the process of the present invention. Those skilled in the art will appreciate that the process of the present invention can be used to form a variety of structures in a semiconductor substrate at a relatively shallow junction depth. Accordingly, the following process is merely illustrative of a process for the fabrication of a non-volatile semiconductor device that incorporates the process of the present invention.

FIGS. 2–6 illustrate, in cross-section, processing steps in accordance with an illustrative embodiment of the invention for the fabrication of a bit-line structure in an EEPROM device.

Figure 2:
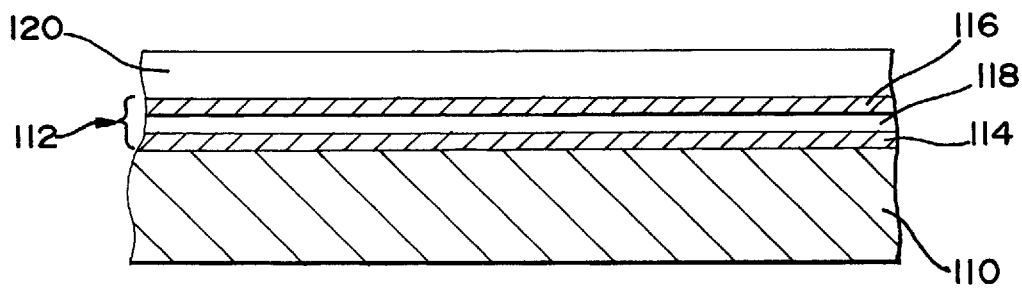
FIGS. 2–6, illustrate, cross-section, processing steps in accordance with an exemplary embodiment of the invention.

Shown in FIG. 2, in cross-section, is a portion of a semiconductor substrate 110 having already undergone several processing steps in accordance with the invention. An ONO layer 112 overlies semiconductor substrate 110 and includes a first oxide layer 114, a second oxide layer 116 and a silicon nitride layer 118 that is sandwiched between first oxide layer 114 and second oxide layer 116. A resist layer 120 overlies ONO layer 112. As described above, resist layer 120 can be one of a number of different types of resist, including optical photoresist responsive to visible and near UV light, deep-UV resist and the like. Alternatively, resist layer 120 can be an inorganic resist layer, an X-ray resist layer and the like. In a preferred embodiment, resist layer 120 is a Novolak-type photoresist material.

Figure 3:
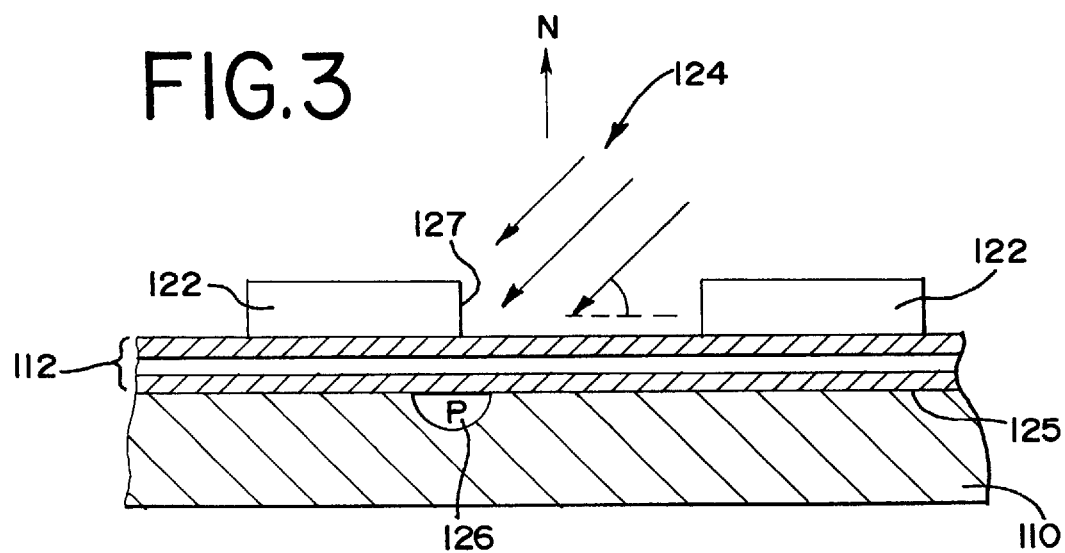

After forming resist layer 120, the resist material is exposed and developed to form a resist pattern 122 overlying ONO layer 112. The exposure and development process creates an opening 124 exposing a section of ONO layer 112. For the purpose of illustration, the following description will be limited to only a portion of semiconductor substrate 110. However, those skilled in the art will recognize that the exposure and development process creates a masking pattern over a large area of semiconductor substrate 110 and many such regions such as that illustrated in FIG. 3 are formed during the patterning process.

After forming opening 124, an angled, molecular ion implantation process is carried out to form a pocket region 126 in semiconductor substrate 110. Preferably, pocket region 126 is formed by the ion implantation of $BF_2^+$ ion at an angle of instance of about 20° to about 45° with respect to normal (N) of a principal surface 125 of semiconductor substrate 110. The angled molecular ion implantation process forms pocket region 126 and semiconductor substrate 110 in a location that partially underlies a first substantially vertical sidewall 127 of resist pattern 122. During the molecular ion implantation process, the $BF_2^+$ ions penetrate ONO layer 112 and enter semiconductor substrate 110 at an angle sufficient to create a pocket region that extends at least partially beneath first substantially vertical sidewall 127 of resist pattern 122.

Figure 4:
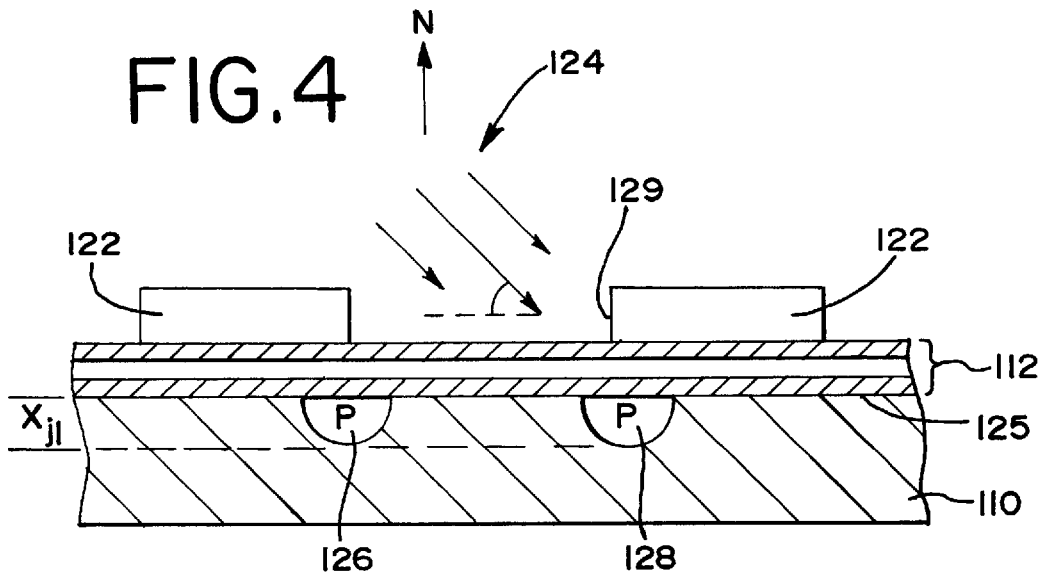

The exemplary process continues, as illustrated in FIG. 4, with the formation of a second pocket region 128. Second pocket region 128 is located at the opposite side of opening 124 from pocket region 126. Again, an angled, molecular ion implantation process is carried out such that second pocket region 128 is formed in semiconductor substrate 110 to underlie a portion of resist pattern 122. Preferably, pocket region 128 is formed to at least partially underlie a second vertical sidewall 129 of opening 124. Preferably, the offset angle used in the molecular ion implantation process to form first pocket region 126 is maintained during the formation of second pocket region 128. Additionally, the same ion implantation energy is also used to form both first and second pocket regions 126 and 128. Accordingly, first and second pocket regions 126 and 128 are symmetrically formed about opening 124. The implant angle and implant energy are selected to form first and second pocket regions 126 and 128 to a predetermined junction depth in semiconductor substrate 110.

Figure 5:
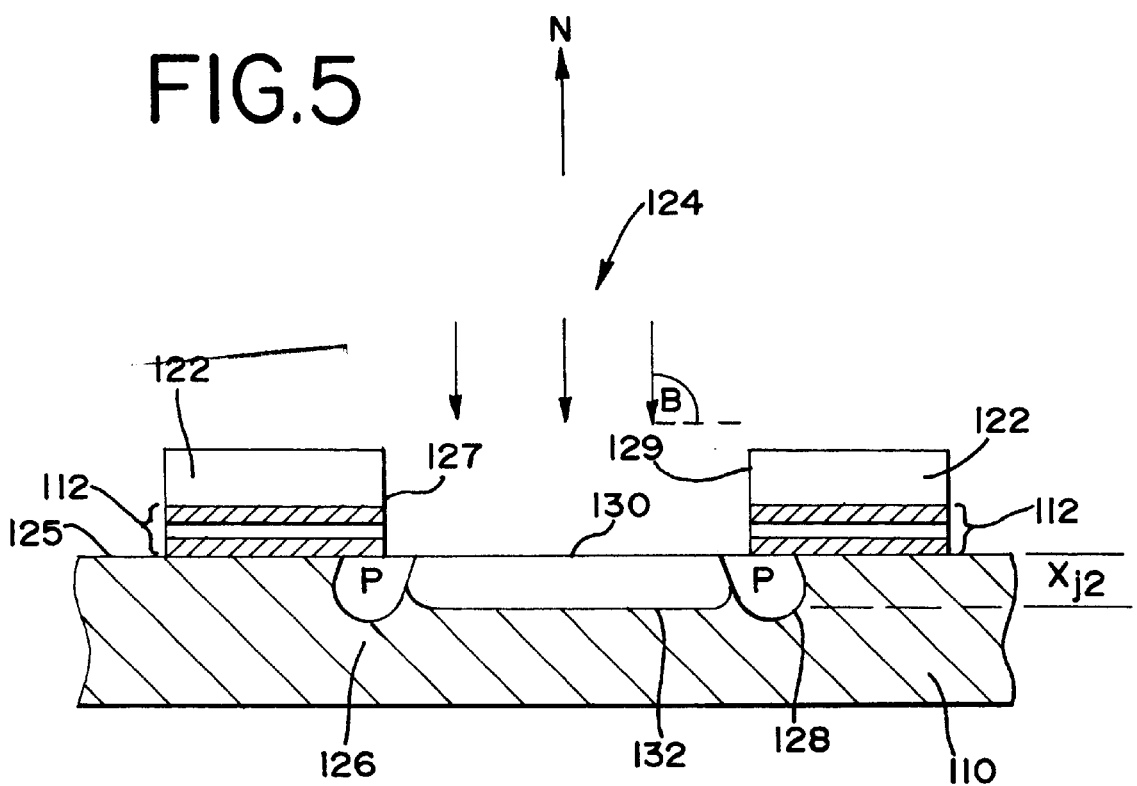

After forming first and second pocket regions 126 and 128, portions of ONO layer 112 exposed by resist pattern 122 are etched to expose a portion of principal surface 125, as illustrated in FIG. 5. Preferably, resist pattern 122 is used as an etching mask such that the etching process exposes principal surface 125 in selected regions 130 defined by resist mask 122. In a preferred embodiment, ONO layer 112 is anisotropically etched such that ONO layer 112 and resist pattern 122 have continuous, substantially vertical first and second sidewalls 127 and 129.

After completion of the etching process, in a preferred embodiment, an ion implantation process is carried out to form a buried bit-line 132 in selected region 130 of semiconductor substrate 110. Preferably, an n-type dopant, such as arsenic, is ion implanted at an angle of incidence substantially equivalent to the normal (N) of principal surface 125 of semiconductor substrate 110. The ion implantation energy is selected so as to form buried bit-line 132 to a selected junction depth ($X_{j2}$) in semiconductor substrate 10. Preferably, the ion implantation energy is of sufficient magnitude such that the junction depth of buried bit-line 132 is less than the junction depth $X_{j1}$ of first and second pocket regions 126 and 128. In a preferred embodiment of the invention where the pocket regions are formed to a junction depth of about 0.30 microns to about 0.45 microns, buried bit-line 132 is formed to a junction depth of about 0.07 microns to about 0.12 microns.

Those skilled in the art will recognize that the order of formation of pocket regions 126 and 128, and buried bit-line 132 can be reversed from that described above. In an alternative embodiment, before etching ONO layer 112, an implant process can be carried out to form bit-line 132, followed by an angled, molecular ion implant process to form pocket regions 126 and 128. In yet another alternative embodiment, ONO layer 112 can be etched before either implant process is carried out. Accordingly, all such variations and modifications are within the scope of the present invention.

Figure 6:
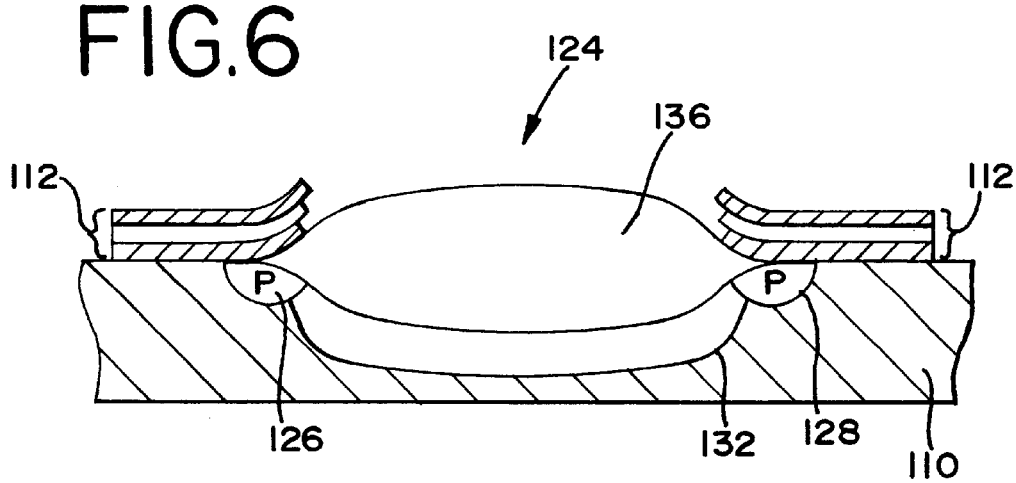

The illustrative process continues, as illustrated in FIG. 6, with removal of resist pattern 122 and the formation of a bit-line oxide layer 136. In a preferred embodiment, bit-line oxide layer 136 is formed by thermal oxidation of semiconductor substrate 110 using ONO layer 112 as an oxidation mask. ONO layer 112, having been previously patterned by the etching process described above, exposes select regions 124 of semiconductor substrate 110.

Thus, it is apparent that there has been described, in accordance with the invention, a process for fabricating shallow pocket regions in a non-volatile semiconductor device that fully provides the advantages set forth above. Although the invention has been described and illustrated with reference with specific, illustrative embodiments thereof, it is not intended that the invention be limited to those illustrative embodiments. Those skilled in the art will recognize that variations and modifications can be made without departing from the spirit of the invention. For example, the conductivity of the doping and the substrate can be reversed from that described above. Accordingly, the pocket regions can be formed to have an n-type conductivity, and the buried bit-line can be formed to have a p-type conductivity. It is, therefore, intended to include within the invention all such variations and modifications as fall within the scope of the appended claims and equivalents thereof.

What is claimed is:

1. A process for fabricating a non-volatile semiconductor device comprising the steps of:

providing a semiconductor substrate having a principal surface and a patterned layer thereon, wherein the patterned layer has an opening, the opening having substantially vertical first and second edge surfaces;

implanting a molecular ion species into the substrate at a predetermined angle with respect to the normal of the principal surface so as to form first and second regions to a first junction depth in the substrate, wherein the first pocket region partially underlies the first edge surface and the second pocket partially underlies the second edge surface; and forming a bit-line region to a second junction depth in the substrate below the opening in the patterned layer, wherein the second junction depth is less than the first junction depth.

2. The process of claim 1, wherein the step of implanting a molecular ion species comprises implanting boron difluoride.

3. The process of claim 2, wherein the step of implanting is carried out at an angle of about 20 degrees to about 45 degrees with respect to normal to form the first and second pocket regions to the first junction depth.

4. The process of claim 1, wherein the patterned layer comprises at least an ONO layer.

5. The process of claim 1, wherein the patterned layer comprises a resist layer overlying an ONO layer.

6. The process of claim 1 further comprising the step of forming a bit-line oxide layer in the substrate overlying the bit-line region.

7. A process for fabricating a semiconductor device comprising the steps of:

providing a substrate having a principal surface;

forming a patterned layer on the principal surface, wherein the patterned layer has an opening that exposes a bit-line region of the substrate, and wherein the opening has first and second edges substantially normal to the principal surface;

implanting molecular ions into the bit-line region of the substrate to form first and second pocket regions therein, the first pocket region partially underlying the first edge of the opening and the second pocket region partially underlying the second edge of the opening; and forming a buried bit-line in the substrate below the opening.

8. The process of claim 7, wherein the step of implanting molecular ions comprises implanting molecular ions of a first conducting type, and wherein the step of forming a buried bit-line comprises doping the substrate with a dopant of a second conductivity type.

9. The process of claim 8, wherein the step of doping the substrate comprises implanting ions of the second conductivity type.

10. The process of claim 7, wherein the steps of forming a patterned layer comprises forming an ONO layer overlying the principal surface and forming a resist layer overlying the ONO layer.

11. The process of claim 7, wherein the step of forming first and second pocket regions comprises forming the pocket regions to a first junction depth, and wherein the step of forming a buried bit-line comprises forming the buried bit-line to a second junction depth, wherein the second junction depth is less than the first junction depth.

12. The process of claim 7, wherein the step of implanting molecular ions comprises implanting boron difluoride ions.

13. The process of claim 12, wherein the step of implanting boron difluoride ions comprises implanting at a predetermined angle of incidence with respect to the normal of the principal surface.

14. A process for fabricating a non-volatile semiconductor device comprising the steps of:

providing a substrate having a principal surface;

forming a masking layer on the principal surface, the masking layer having an opening;

implanting boron difluoride molecular ions into the substrate at an offset angle with respect to the normal of the principal surface to form first and second pocket regions at a first junction depth;

forming an n-type buried bit-line in the substrate to a second junction depth, wherein the second junction depth is less than the first junction depth.

15. The process of claim 14, wherein the step of implanting boron difluoride molecular ions comprises implantation at an energy of about 50 KeV to about 80 KeV.

16. The process of claim 15, wherein the step of implanting boron difluoride molecular ions comprises implantation at an angle of incidence of about 20 degrees to about 45 degrees with respect to the normal of the principal surface.

17. The process of claim 14, wherein the step of forming a masking layer comprises forming a composite layer including an ONO layer overlying the principal surface and a resist layer overlying the ONO layer, and wherein the opening has substantially vertical first and second sidewalls.

18. The process of claim 17, wherein the step of implanting boron difluoride molecular ions into the substrate comprises forming the first pocket region to at least partially underlie the first substantially vertical sidewall and forming the second pocket region to at least partially underlie the second substantially vertical sidewall.

19. The process of claim 14, wherein the step of implanting boron difluoride molecular ions into the substrate comprises forming the first and second pocket regions to a junction depth of about 0.30 microns to about 0.45 microns.

* * * * *